United States Patent [19]

Luce

[11] 3,974,461

[45] Aug. 10, 1976

[54] WIDE DYNAMIC RANGE VOLTAGE CONTROLLED FILTER FOR ELECTRONIC MUSICAL INSTRUMENTS

[75] Inventor: David A. Luce, Clarence Center, N.Y.

[73] Assignee: Moog Music, Inc., Williamsville, N.Y.

[22] Filed: June 14, 1974

[21] Appl. No.: 479,487

[52] U.S. Cl. .................................. 332/17; 84/1.11; 84/1.19; 84/DIG. 9; 333/17 R; 333/70 CR

[51] Int. Cl.² ...................... G10H 1/04; H03H 7/10

[58] Field of Search ............... 332/17, 18; 328/167; 307/295; 333/17 R, 17 L, 17 M, 70 R, 70 CR; 84/1.01, 1.11, 1.19, 1.24, 1.25, DIG. 10, DIG. 9

[56] References Cited

UNITED STATES PATENTS

| | | | |
|---|---|---|---|
| 2,486,843 | 11/1949 | Hepp | 332/18 |
| 2,679,581 | 5/1954 | Jacob et al. | 332/18 X |
| 3,835,399 | 9/1974 | Holmes | 328/167 |
| 3,890,570 | 6/1975 | Kristensen et al. | 328/167 X |

*Primary Examiner*—Siegfried H. Grimm
*Attorney, Agent, or Firm*—Hill, Gross, Simpson, Van Santen, Steadman, Chiara & Simpson

[57] ABSTRACT

A voltage controlled filter for an electronic synthesizer incorporates a plurality of individual voltage controlled filter stages connected in cascade with a variable feedback interconnecting the input and output stages. Each of the stages is controlled by application of a series of pulses, with the period between successive pulses determining the cutoff frequency of the filter. Application of pulses to the filter stages at different pulse repetition rates changes the cutoff frequency of the filter and modifies the relative amplitudes of different frequency components of an audio signal to be passed by the filter. The filter is suited for use with high level signals and provides an extremely wide dynamic range through a very high signal-to-noise ratio.

14 Claims, 2 Drawing Figures

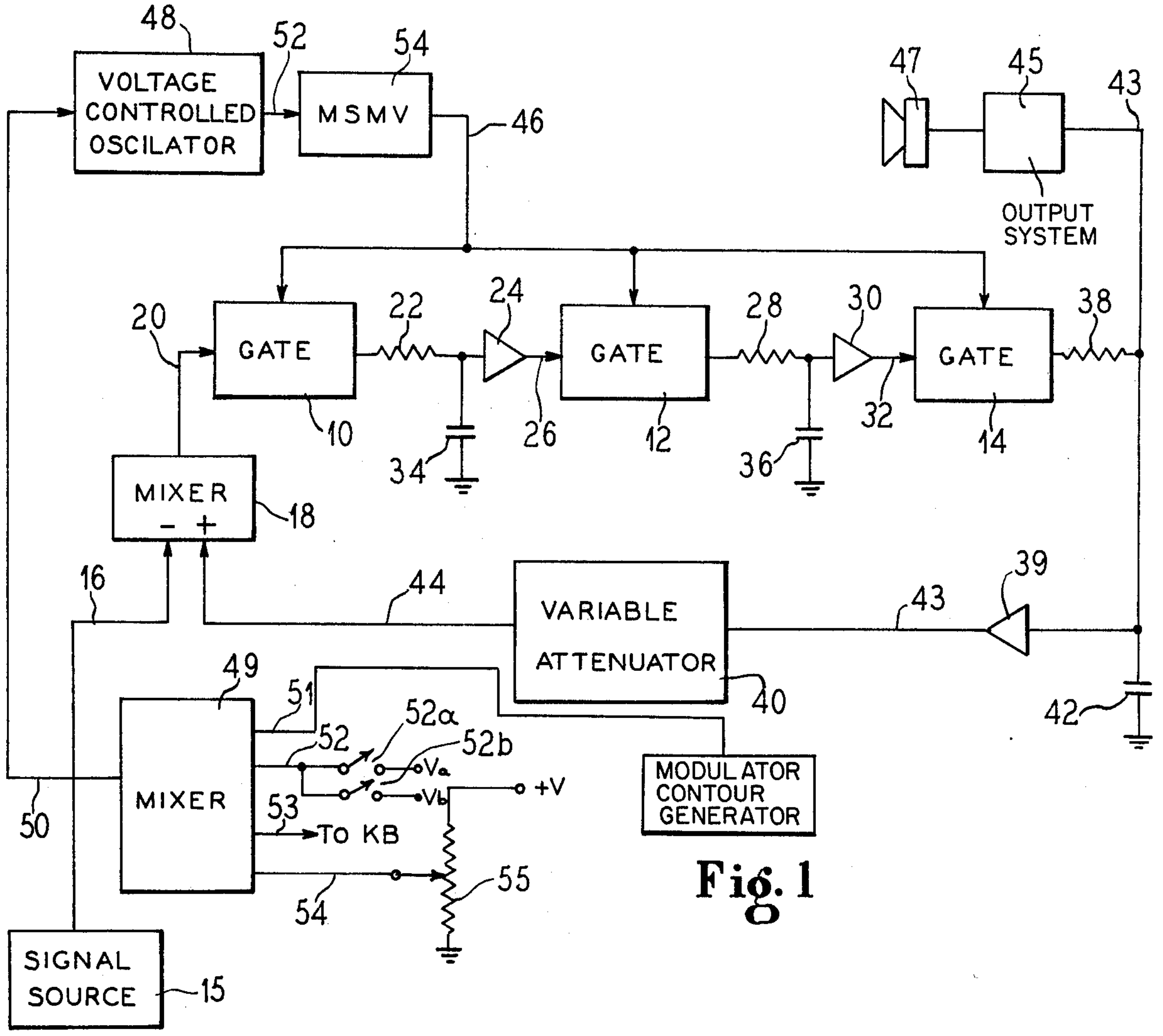
Fig. 1
Fig. 2
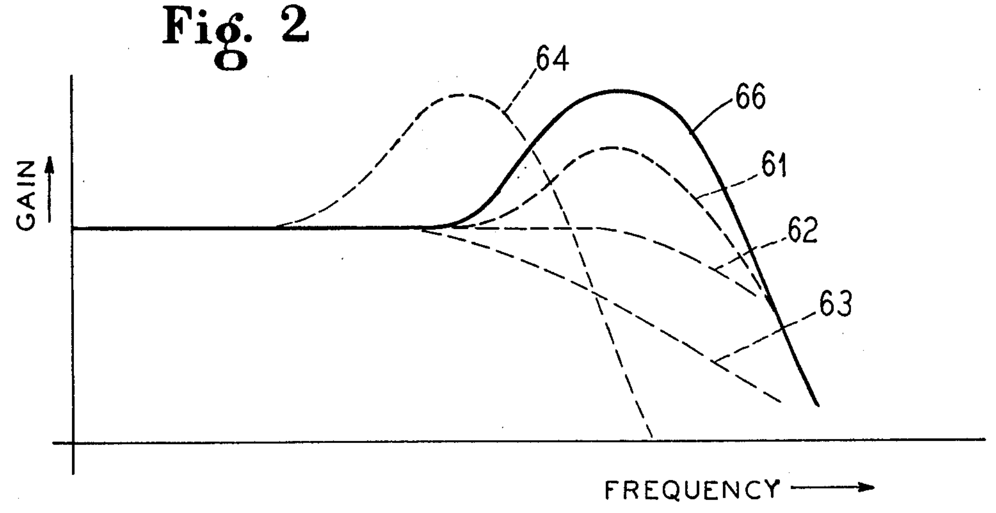

WIDE DYNAMIC RANGE VOLTAGE CONTROLLED FILTER FOR ELECTRONIC MUSICAL INSTRUMENTS

BACKGROUND

1. Field of the Invention

The present invention relates to electronic musical instruments, and more particularly to electronic synthesizers.

2. The Prior Art

Electronic synthesizers have been developed in a variety of configurations. Practically all of the heretofore developed configurations employ some apparatus for generating an a.c. signal in response to operation of a manual control, such as a key of a keyboard or the like. Most configurations also include apparatus for varying the wave shape of the envelope used for modulating the amplitude or other characteristics of the output signal and means for passing the modulated signal through an audio amplifier system to a loudspeaker or the like. Signals are also sometimes passed through a filter having an adjustable bandpass, which modifies the characteristics of the sounds produced.

Previous designs for variable parameter filters required the use of relatively low signal levels and, as a result, are characterized by relatively low signal-to-noise ratios, which seriously limits the dynamic range of the instrument using such filters.

Accordingly, there is a need for a method and apparatus for controlling the frequency characteristics of a filter which is capable of a wider dynamic range than has heretofore been available.

SUMMARY OF THE PRESENT INVENTION

It is a principal object of the present invention to provide a voltage controlled filter arrangement which is operable to control a signal conduction with a wider dynamic range than has been heretofore available.

Another object of the present invention is to provide such a voltage controlled filter which is useable with relatively high level signals.

A further object of the present invention is to provide a voltage controlled filter useable in connection with an electronic synthesizer or the like for controlling an output signal both in frequency and in amplitude as a function of the voltage applied to a control input of the filter.

A further object of the present invention is to provide a voltage controlled filter having an upper cutoff frequency and a peaking frequency located below the cutoff frequency, with both the cutoff frequency and the peaking frequency being varied as a function of a control voltage applied to the filter.

These and other objects and advantages of the present invention will become manifest upon an inspection of the following description and the accompanying drawings.

In accordance with one embodiment of the present invention there is provided a voltage controlled filter comprising a plurality of low-pass filter stages connected in cascade, each stage incorporating an individual gate circuit, and a feedback connection interconnecting the first and last stages, together with means for applying a train of pulses simultaneously to each of said gate circuits, said train having a variable spacing between successive pulses of said train, whereby the filter is effective to modulate a connection between a signal source and an output circuit and to modulate the cutoff frequency of said filter stages, both in response to the pulse repetition rate applied to said filter stages.

BRIEF DESCRIPTION OF THE DRAWINGS

Reference will now be made to the accompanying drawings, in which:

FIG. 1 shows a functional block diagram for an illustrative embodiment of the present invention; and FIG. 2 shows a graph of the gain of the system, as a function of frequency, for several different conditions.

DESCRIPTION OF THE PREFERRED EMBODIMENTS

Referring now to FIG. 1, the voltage controlled filter is illustrated incorporating three separate low-pass filter stages, each incorporating one of a plurality of gate circuits 10, 12, and 14. An audio input signal from a source 15 is applied to an input line 16 and passed through a mixer 18 to arrive at the input of the gate 10 over a line 20. The output of the gate 10 is passed through a resistor 22 and an amplifier 24 to reach the input line 26 of a second filter gate 12. Similarly, the output of the gate 12 is passed through a resistor 28 and an amplifier 30 to reach the input line 32 of the third gate 14. The junction of the resistor 22 and the input of the amplifier 24 is connected by a capacitor 34 to ground, and the junction of the resistor 28 and the input of the amplifier 30 is also connected to ground by a capacitor 36.

The output of the filter gate 14 is connected through a resistor 38 and an amplifier 39 over a line 43 to the input of an attenuator 40. The junction of the resistor 38 and the input of the amplifier 39 is connected to ground by a capacitor 42. The output of the attenuator 40 is connected by a line 44 to a second input of the mixer 18. The line 43 is connected to the output system 45, which preferably incorporates a loudspeaker 47.

The control inputs of the gates 10, 12, and 14 are all connected in common with a control line 46. A series of pulses are applied to the control line 46, which pulses are derived from an oscillator 48 which is a square wave generator producing a square wave having a frequency proportional to a control voltage applied to a control input of the oscillator 48 over a line 50. The output of the oscillator 48 is a square wave and is provided on an output line 52 which is connected to the input of a one-shot or mono-stable multivibrator 54. The multivibrator 54 produces a pulse of predetermined duration for each cycle of the square wave produced by the oscillator 48. The pulses applied to the line 46 are therefore all of the same predetermined duration, but are separated by intervals which are inversely related to the frequency of operation of the oscillator 48. The spacing interval is equal to the square wave period less the predetermined duration.

The RC circuits connected with the output of each of the gates 10, 12, and 14 function as low-pass filters, and the amplifiers 24, 30, and 39 each function as impedance transducers, transforming a relatively high input impedance into a relatively low output impedance, so that an adequate current can be produced to drive the components without unduly loading the low-pass filter circuits which precede them. The attenuator 40 also has a relatively high input impedance and a relatively low output impedance. The output impedance of the mixer 18 is also relatively low, so that an adequate current drive can be furnished over the line 20 to the gate 10.

The gain-frequency characteristic of the apparatus of FIG. 1 is illustrated in FIG. 2 and comprises a typical low-pass filter characteristic curve with a peak just below the cutoff frequency of the filter. The cutoff frequency is that frequency at which the open loop gain of the filter is one-half the low frequency gain. The application of the feedback by way of the attenuator 40 causes peaking in the vicinity of the cutoff frequency, above and beyond the gain which is provided for the lowest frequencies. The amount of peaking is controlled by the amount of feedback, which is dependent upon the attenuation introduced by the attenuator 40. This is under the control of the operator, and the amount of attenuation is controlled by manipulation of a potentiometer or the like in the normal way.

The duty cycle of the pulse train applied to the control line 46 determines the cutoff frequency as shown in FIG. 2. When there is a relatively low duty cycle, occurring when the oscillator 48 oscillates at a relatively low frequency, the cutoff frequency is relatively low, and only relatively low frequencies are passed from the input 16 to the output of the system at the line 43. When the duty cycle is higher, at higher operating frequencies of the oscillator 48, higher frequency signals are passed, and the cutoff frequency is increased beyond that for the low duty cycle condition.

When the oscillator 48 is disabled, by removal of the control voltage from the line 50, all of the gates 10–14 are cut off, and no frequency components are passed by the voltage controlled filter. In this manner, the connection between the a.c. signals present on the line 16 and the output system 45 is opened, even though a.c. signals remain present on the line 16. The signal generator which produces the a.c. signals need not be disabled, but may run continuously without risking any "leak-through". Start up changes in the frequency of this generator are thereby avoided. Start up changes in the frequency of the oscillator 48 are not critical because the oscillator 48 only controls the duty cycle of the pulse train applied to the control line 46.

The control voltage present on the line 50 is derived from a mixer 49 which functions to mix components of four separate inputs available on lines 51, 52, 53, and 54. Line 51 is adapted to be controlled by the operator in response to the operation of the modulator contour generator, as described in co-pending application entitled "Electronic Musical Instrument with Dynamically Responsive Keyboard", Ser. No. 479,485, filed concurrently herewith.

The modulator contour generator produces an envelope signal which is applied to the line 51 and regulates the initial rate of increase, the maximum amplitude, and the rate of decay of the control voltage. By the use of the modulator contour generator, a piano sound can be simulated by causing the filter to vary its passband and amplitude output in accordance generally with the characteristics of an acoustic piano.

The line 52 is adapted to be connected to a preset unit, so that when one of several preset switches **52*a* and 52*b*** is actuated, a given constant potential V*a* or V*b* is applied to the line 52, in lieu of an envelope signal on the line 51, in order to control the oscillator 48 to produce a pulse train on the line 46 of a predetermined duty cycle.

The line 53 is connected with a keyboard, and is provided with a predetermined potential in response to closing of any of a number of switches, in response to operation of a corresponding key of the keyboard. When a key operated, the potential on the line 53, and therefore the potential on the line 50, is changed instantaneously upon depression of the key, so that the duty cycle of the pulse train applied to the control line 46 is changed rapidly to rapidly open the gates 10, 12, and 14. In this way, operation of a key of the keyboard brings about a predetermined increase in the level of the voltage on the line 50, depending upon the voltage applied to the line 53 through a keyboard switch.

The line 54 is connected to the tap of a potentiometer 55 which is under the control of the operator or player, so that an adjustable minimum voltage level may at all times be applied to the line 50, corresponding to a given minimum duty cycle for the pulse train on the control line 46. By operation of one or more of the devices connected to the lines 51–54, the control voltage applied to the line 50 may be selected and adjusted in a variety of ways to achieve different musical effects.

When the analog gates 10, 12, and 14 are interconnected, as shown in FIG. 1, they form a voltage controlled filter in which the dynamic range is very high. The phase shifts in the RC circuits of the three stages are about equal, and combine to give the desired peaking of the characteristic as shown in FIG. 2. Four or more stages may be employed if desired. The output of the filter is controlled via the potential applied to the control inputs of the gates 10–14, and by controlling the attenuator 40. It has been found that the simultaneous variation of amplitude and passband which results from the use of the present invention produces an extremely desirable and efficient result when associated with the other components of an electronic synthesizer.

In one embodiment of the present invention, the analog gates 10, 12, and 14 are all model CD4016 gates, commercially available from RCA, and the amplifiers 24, 30, and 39 are model 741 integrated circuits, commercially available from a variety of suppliers. The attenuator 40 is an ordinary potentiometer, the mixer 18 is an ordinary differential amplifier such as a model 741, and the mixer 49 is an ordinary summing amplifier or the like.

The solid curve 66 in FIG. 2 is for one condition of the attenuator 40 and one potential level on the line 50. Increasing the attenuation of the attenuator 40 progressively yields the gain curves 61–63, for modifying the shape of the curve, reducing the peaking. Decreasing the voltage on the line 50 without changing the condition of the attenuator 40 reduces the frequency of the oscillator 48 and yields the curve 64, which has generally the same shape as the curve 66 but is shifted to a lower frequency. Thus, reducing the voltage on the line 50 to a low potential has the effect of cutting off transmission from the source 15 to the output system 45. The dynamic range of the filter is about 110 db. Varying the level on the line 50 at a higher level has the effect of modulating the transmission to the output system with respect to both its amplitude and the relative amplitudes of different frequency components of the transmission.

Although a preferred embodiment of the present invention has been described in the foregoing, it will be obvious to those skilled in the art that various modifications and changes may be made without departing from the essential features of novelty thereof, which are intended to be defined and secured by the appended claims.

What is claimed is:

1. A wide dynamic range voltage controlled filter comprising a plurality of filter stages connected in cascade, each stage incorporating an individual gate circuit, a feedback connection interconnecting the output of said voltage controlled filter with its input, and selectively operable control means for simultaneously energizing all of said gate circuits.

2. Apparatus according to claim 1, wherein said control means comprises a pulse generator and means for connecting the output of said pulse generator simultaneously to a control input of each of said gate circuits.

3. Apparatus according to claim 2, wherein said pulse generator comprises means for producing a train of pulses of equal duration, and means for controlling the interval between said pulses of said pulse train.

4. Apparatus according to claim 3, including a monostable multivibrator for producing said pulses, and a voltage controlled oscillator connected to said multivibrator for causing said multivibrator to produce a pulse for each cycle of said oscillator.

5. Apparatus according to claim 1, wherein each of said filter stages comprises an RC low-pass filter.

6. Apparatus according to claim 1, wherein said feedback connection comprises a variable attenuator, whereby the quantity of signal feedback is selectable by an operator.

7. Apparatus according to claim 1, including a mixer for mixing an input signal with a feedback signal from said output and connecting means for connecting said mixer to the first filter stage of said voltage controlled filter.

8. Apparatus according to claim 7, including a second mixer connected to receive a plurality of individually developed control signals, and connecting means connecting said second mixer to said control means for supplying the input signal thereto.

9. An electronic musical instrument including a signal source, an output system, and a modulator system interposed between said source and said output system, said modulator system incorporating a plurality of modulator stages connected in cascade with a feedback connection interconnecting said first and last stages, and means for simultaneously controlling all of said modulator stages to simultaneously modulate the frequency response of said modulator system and the amplitude of a signal transmitted from said source to said output system.

10. Apparatus according to claim 9, including means for modifying said feedback connection for controlling the frequency response of said modulator system.

11. Apparatus according to claim 9, wherein each of said modulator stages comprises a voltage controlled filter, with the cutoff frequency of said filter being variable in response to a control signal, for modulating the amplitude of said input signal in response to its frequency, in relation to the cutoff frequency of said filter.

12. Apparatus according to claim 11, wherein each of said voltage controlled filters comprises a low-pass filter.

13. In an electronic musical instrument, the method of controlling the amplitude of a signal passed from a signal source to an output system, said signal source producing a signal having a frequency within a range of frequencies, comprising the steps of providing a plurality of voltage controlled filter stages connected in cascade, providing feedback means, and simultaneously providing a control voltage to each of said stages for simultaneously controlling the cutoff frequency of each of said filter stages.

14. The method according to claim 13, including the step of introducing a feedback signal to the input of a first of said filter stages through a variable attenuator.

* * * * *